US011522335B2

(12) United States Patent
Schaller et al.

(10) Patent No.: US 11,522,335 B2
(45) Date of Patent: Dec. 6, 2022

(54) TRANSMITTING DEVICE WITH A SCANNING MIRROR COVERED BY A COLLIMATING COVER ELEMENT

(71) Applicant: JENOPTIK Optical Systems GmbH, Jena (DE)

(72) Inventors: Uwe Schaller, Kahla (DE); Christian Raabe, Jena (DE)

(73) Assignee: JENOPTIK OPTICAL SYSTEMS GMBH, Jena (DE)

( * ) Notice: Subject to any disclaimer, the term of this patent is extended or adjusted under 35 U.S.C. 154(b) by 419 days.

(21) Appl. No.: 16/640,704

(22) PCT Filed: Aug. 2, 2018

(86) PCT No.: PCT/DE2018/100682
§ 371 (c)(1),
(2) Date: Feb. 20, 2020

(87) PCT Pub. No.: WO2019/037810
PCT Pub. Date: Feb. 28, 2019

(65) Prior Publication Data
US 2020/0355798 A1  Nov. 12, 2020

(30) Foreign Application Priority Data

Aug. 21, 2017  (DE) ...................... 20 2017 105 001.7
Oct. 13, 2017  (DE) ...................... 10 2017 123 878.6

(51) Int. Cl.
*H04B 10/00* (2013.01)
*H01S 5/00* (2006.01)
(Continued)

(52) U.S. Cl.
CPC .......... *H01S 5/0071* (2013.01); *B81B 7/0067* (2013.01); *G01S 7/4815* (2013.01);
(Continued)

(58) Field of Classification Search
CPC ... H04B 10/11; H04B 10/112; H04B 10/1123; H04B 10/114; H04B 10/1143;
(Continued)

(56) References Cited

U.S. PATENT DOCUMENTS

| 6,771,686 B1 | 8/2004 | Ullman et al. |
| 8,836,922 B1 * | 9/2014 | Pennecot ................ G01S 17/42 356/9 |

(Continued)

FOREIGN PATENT DOCUMENTS

| CN | 102914872 A | 2/2013 |
| DE | 102008049477 A1 | 4/2010 |

(Continued)

OTHER PUBLICATIONS

International Search Report from PCT/DE2018/100682, filed Aug. 2, 2018, dated Nov. 15, 2018.

(Continued)

*Primary Examiner* — Hanh Phan
(74) *Attorney, Agent, or Firm* — Patentbar International PC

(57) ABSTRACT

A transmitting device, preferably containing at least two laser diodes and a scanning mirror, which is deflectable about its center (MP) and is arranged in a housing with a transparent cover element. The cover element is formed, at least in a coupling-out region, by a section of a monocentric hemispherical shell (HK) with a center of curvature (K) and is arranged to cover the scanning mirror in such a way that the center of curvature (K) of the hemispherical shell (HK) and the center (MP) of the scanning mirror coincide, and is formed in a coupling-in region by an optical block, comprising a toroidal entrance surface, in the special form of a cylindrical surface, at least one toroidal exit surface and at (Continued)

least two first mirror surfaces arranged between them, for deflecting and pre-collimating the laser beams.

9 Claims, 5 Drawing Sheets

(51) Int. Cl.
| | | |
|---|---|---|
| *G01S 7/481* | (2006.01) | |
| *G01S 17/42* | (2006.01) | |
| *G02B 26/08* | (2006.01) | |
| *G01S 7/4911* | (2020.01) | |
| *G01S 17/02* | (2020.01) | |
| *G02B 26/10* | (2006.01) | |
| *H01S 5/02255* | (2021.01) | |
| *B81B 7/00* | (2006.01) | |

(52) U.S. Cl.
CPC ........... *G01S 7/4817* (2013.01); *G01S 7/4911* (2013.01); *G01S 17/02* (2013.01); *G01S 17/42* (2013.01); *G02B 26/0816* (2013.01); *G02B 26/0833* (2013.01); *G02B 26/10* (2013.01); *H01S 5/02255* (2021.01); *G01S 7/4813* (2013.01); *H01S 5/005* (2013.01)

(58) Field of Classification Search
CPC .. H04B 10/1149; H04B 10/40; H04B 10/116; G01S 7/4817; G01S 17/42; G01S 17/08; G01S 7/4815; G01S 7/4816; G01S 17/10; G01S 17/497; G02B 26/10; G02B 26/0833
USPC ....... 398/169, 170, 118, 119, 127, 128, 129, 398/130, 131, 135, 136, 158, 159, 172; 356/4.01, 5.01, 3.01, 4.1
See application file for complete search history.

(56) References Cited

U.S. PATENT DOCUMENTS

| | | |
|---|---|---|
| 9,086,273 B1 | 7/2015 | Gruver et al. |
| 9,618,622 B2 * | 4/2017 | Geiger ................. G01S 7/4811 |
| 2008/0123170 A1 | 5/2008 | Reichert et al. |
| 2017/0299721 A1 * | 10/2017 | Eichenholz ......... H01S 3/06733 |

FOREIGN PATENT DOCUMENTS

| | | |
|---|---|---|
| DE | 102011006159 A1 | 9/2012 |
| DE | 102012025281 A1 | 6/2014 |
| DE | 102015110141 A1 | 12/2016 |

OTHER PUBLICATIONS

Ito, Kota et al, System Design and Performance Characterization of a MEMS-Based Laser Scanning Time-of-Flight Sensor Based on a 256×64-pixel Single-Photon Imager, IEEE Photonics Journal, Apr. 2013, p. 6800114, vol. 5, No. 2.

Yang, B. et al, A Compact MEMS-Based Wide-Angle Optical Scanner, Dept. of Electrical & Computer Engineering, University of Florida, Gainesville, FL, USA, IEEE 2017.

Siepmann J. P. et al., Integrable Ultra-Compact, High-Resolution, Real-Time MEMS Ladar for the Individual Soldier, LightTime, Oshkosh, WI, MILCOM, Oct. 2005, pp. 1-7 (as per International Search Report).

* cited by examiner

TRANSMITTING DEVICE WITH A SCANNING MIRROR COVERED BY A COLLIMATING COVER ELEMENT

RELATED APPLICATIONS

This Application is a National Phase Application of International Application PCT/DE2018/100682, filed on Aug. 2, 2018, which in turn claims priority to German Patent Applications DE 20 2017 105 001.7, filed Aug. 21, 2017 and DE 10 2017 123 878.6, filed Oct. 13, 2017, all of which are incorporated herein by reference in their entirety.

FIELD OF THE INVENTION

The invention relates to a transmitting device for a LIDAR scanner which uses collimated laser radiation to scan at least one scan angle range.

In distance measurement, in which individual scan points are imaged quasi to infinity, the individual scan angle ranges have a three-dimensional extension by scanning a two-dimensional scan field or a two-dimensional extension by scanning a one-dimensional scan line.

While the extent of the scan field or scan line is limited by the maximum deflection angle of the scanning mirror, its depth is basically determined on the one hand by the Beer-Lambert law, according to which the intensity of the radiation decreases exponentially with the path of travel, and on the other hand by the required laser class, which limits the power of the radiation source.

Large scan angle ranges are of interest, for example, where a large spatial area is to be monitored without interruption. Areas of application can be e.g. aviation, shipping, military technology or autonomous driving of road vehicles.

When using a rotating mirror as a scanning mirror by which large scan angles can be covered, further discrete components such as holders in which the mirror axis is supported are required. The friction generated by the rotation leads to wear and the resulting slippage. In addition, assemblies made of discrete components are nowadays generally more complex to manufacture and therefore more expensive than monolithic assemblies. They are also less easy to miniaturize and tend to be heavier.

MEMS (micro-electro-mechanical system) mirrors, which are monolithically connected to a frame via flexure hinges, operate completely wear-free, with two flexure hinges arranged around the center of the MEMS mirror offset from each other by 180° forming an axis of rotation when viewed mechanically. There are commercially available MEMS mirrors that can only be deflected around one axis of rotation, around two axes of rotation that are perpendicular to each other, or around three or more joints that form individual suspensions. The deflection angle of the MEMS mirror relative to the frame is limited to approx. +/−10° around an undeflected zero position due to the flexure hinge connection. The frictionless operation, its high achievable operating frequency and the meanwhile comparatively low price make MEMS mirrors very attractive especially for dynamic, compact and robust devices.

When using MEMS mirrors as scanning mirrors for a transmitting device of a LIDAR scanner, however, the limited, small deflection angle is a disadvantage. The maximum scan angle range for a laser beam reflected by the MEMS mirror is four times the maximum deflection angle and is therefore no more than approx. 40°. It would be obvious to use multiple MEMS mirrors to achieve a larger combined scan angle range from the scan angle ranges of the individual MEMS mirrors or to create multiple scan angle ranges that are spaced apart. On the one hand, however, this would compromise the compactness of the device and, on the other hand, technical measures would have to be taken to synchronize the movement of the MEMS mirrors. Directing several laser beams at different angles of incidence onto a MEMS mirror instead, so that they scan several contiguous individual scan angle ranges that join together to form a large scan angle range, would have the disadvantage that a cover element placed in front of the MEMS mirror, which is known from the prior art only in the form of a planar plate, would influence the individual laser beams differently. In addition, each laser beam would require a laser beam source with a collimator arranged downstream in the beam direction, with the laser beam sources having to be aligned to each other in their beam direction so that they impinge on the MEMS mirror at certain different angles of incidence.

Regardless of whether the scanning mirror is a MEMS mirror or not, there may be reasons why the scanning mirror is enclosed in a housing and covered by a cover element and thus protected. As far as is known, the cover element is always a transparent planar plate arranged parallel or inclined to the undeflected mirror.

A laser beam impinging on the cover element, which may optionally also relate to several laser beams directed at the scanning mirror, and each of the laser beams after reflection on the scanning mirror, consequently undergoes more or less Fresnel losses, depending on the angle of incidence on the planar plate, which more or less reduce the intensity of the laser beam depending on the location. In addition, undesired reflections may occur on the cover element.

BACKGROUND OF THE INVENTION

DE 10 2012 025 281 A1 discloses an optical object detection unit with a transmitting unit is known, which contains a transmitter for emitting a laser beam, a micromirror which can be pivoted about its center in one or two pivoting directions and a transmitter lens which is arranged downstream of the micromirror in the transmission beam path, covering it. The transmitter lens, designed as a meniscus lens, can also function here as a cover for a housing of the transmitting unit. A disadvantage here is that the micromirror cannot be housed on its own, since the laser beam cannot be guided towards the micromirror via the transmitter lens.

DE 10 2011 006 159 A1 discloses a projection device comprising an MEMS mirror that can be swiveled into at least two switching positions and is covered by a gradient index lens. The gradient index lens is a very positively refractive plano-convex lens or a very positively refractive meniscus, respectively, whose planar or concave surface, respectively, is arranged facing the MEMS mirror. A presumably parallel laser beam incident through the gradient index lens is focused on the MEMS mirror and, after reflection, is collimated again if necessary when passing through the gradient index lens again. One disadvantage is that the MEMS mirror, limited by the planar surface of the gradient index lens, has only a very small swivel range, and the other is that laser beams that may come from different angles of incidence do not impinge on the MEMS mirror at the same point due to refraction at the planar or concave surface, respectively, of the gradient index lens.

SUMMARY OF THE INVENTION

It is the object of the invention to find a transmitting device, comprising a scanning mirror protected by a cover element, for a LIDAR scanner, wherein only low Fresnel losses, if any, and no undesired reflections occur at the cover element. In addition, the transmitting device should have a compact design and require little adjustment in production.

The object of the invention is achieved by the features of claim 1. Advantageous embodiments are set forth in the subclaims which refer back to claim 1.

The invention will be explained in more detail below with reference to exemplary embodiments and drawings.

Figure 1A:
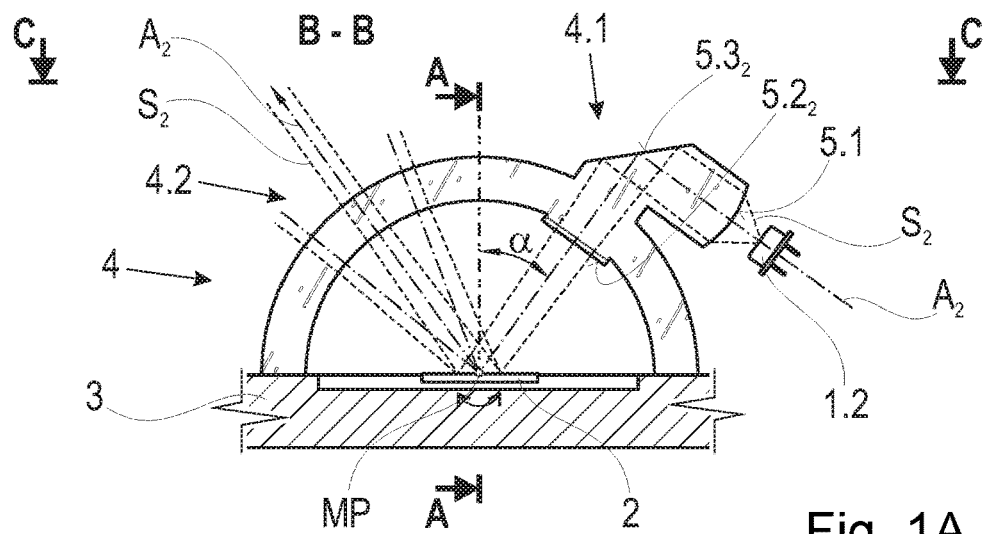
FIGS. 1A-1C are schematic diagrams showing a first exemplary embodiment of a transmitting device.
Figure 1B:
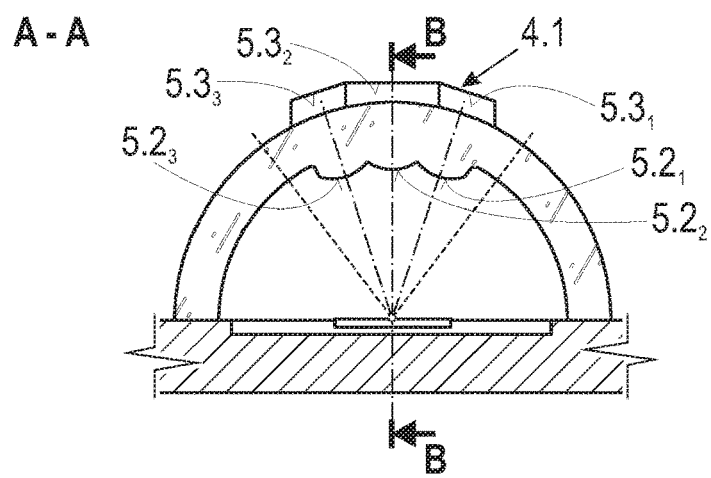
Figure 1C:
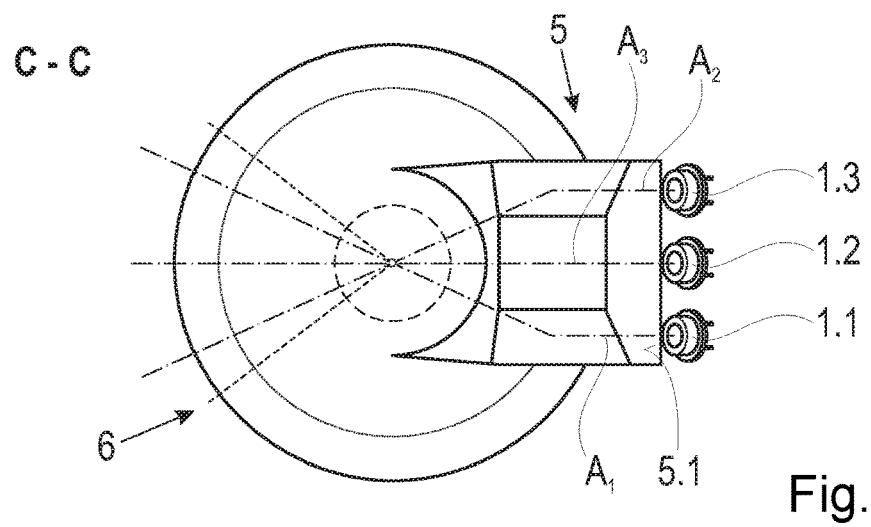

A transmitting device according to the invention contains in all embodiments, as shown for example in FIGS. 1A to 1C, either a single laser diode 1.1 or at least two laser diodes $1.1, \ldots, 1.n$, which each emit a laser beam $S_1, \ldots, S_n$ with a beam axis $A_1, \ldots, A_n$ and with different angles of radiation in a fast axis fa and a slow axis sa.

If the transmitting device contains at least two laser diodes $1.1, \ldots, 1.n$, they are arranged side by side in the direction of their slow axis sa, forming a row, and the beam axes $A_1, \ldots, A_n$ are parallel to each other. Compared to an arrangement in which the beam axes enclose an angle with each other, they can thus be arranged closer together and no adjustment is required to set the angular position.

Moreover, the transmitting device contains a scanning mirror 2, which is deflectable about its center MP and is arranged in a housing 3 with a transparent cover element 4. The beam axis $A_1, \ldots, A_n$ of the at least one laser beam $S_1, \ldots, S_n$ is directed at the cover element 4 in such a way that, after passage of the at least one laser beam $S_1, \ldots, S_n$ through the cover element 4 within a coupling-in region 4.1, it impinges on the center MP, and that the at least one laser beam $S_1, \ldots, S_n$, after reflection at the scanning mirror 2, passes through the cover element 4.2 again within a coupling-out region 4.2.

It is essential to the invention that the cover element 4 has a toroidal entrance surface 5.1 in the coupling-in region 4.1, for pre-collimating the at least one laser beam $S_1, \ldots, S_n$ in the direction of the fast axis fa, a respective first mirror surface $5.3_1, \ldots, 5.3_n$ assigned to the at least two laser diodes $1.1, \ldots, 1.n$, for deflecting the laser beams $S_1, \ldots, S_n$ to the center MP, and at least one toroidal exit surface $5.2_1, \ldots, 5.2_n$, for pre-collimating the at least one laser beam $S_1, \ldots, S_n$ in the direction of the slow axis sa. A toroidal surface is understood to be the surface or a section of the surface of a body that can be created geometrically by rotating a planar figure about an axis of rotation that is in the same plane as the figure itself. Such a body will also be called a toroid. Important special cases or limit cases of a toroid are torus, sphere and circular cylinder as well as cylindrical bodies with any (especially parabolic) cross-section. Surfaces and sections of surfaces of such special or limit cases are therefore also regarded as examples of toroidal surfaces. It is common practice for the person skilled in the art to slightly modify the surface for the correction of image errors.

A toroidal (refracting or reflecting) optical surface generally influences the beam shape differently in two mutually perpendicular directions. In the special or limit case of a cylindrical lens (whose cross-sectional shape need not be spherical), the beam shape remains unaffected in one direction. In the special or limit case of an ordinary spherical lens, it is influenced equally in both directions.

It is further essential to the invention that the cover element 4 is formed, at least in the coupling-out region 4.2, by a section of a monocentric hemispherical shell HK and that the cover element 4 is arranged to cover the scanning mirror 2 in such a way that the center of curvature K of the imaginary monocentric hemispherical shell HK (hereinafter referred to only as hemispherical shell HK) and the center MP of the scanning mirror 2 coincide. Monocentric means that the centers of curvature of the two surfaces of the hemispherical shell HK coincide. Manufacturing and assembly-related tolerances, long-term drifts as well as tolerance deviations between the position of the center of curvature K and the center MP lead to a deteriorating beam quality, but are tolerable within limits.

Completely independent of an angle of incidence $\alpha_1, \ldots, \alpha_n$, at which the at least one laser beam $S_1, \ldots, S_n$ impinges on the scanning mirror 42 with respect to the perpendicular L of the undeflected scanning mirror 42, the beam axis $A_1, \ldots, A_n$ after reflection at the scanning mirror 42, regardless of its position during the deflection, always impinges perpendicularly on the section of the hemispherical shell HK formed in the coupling-out region 4.2.

As they pass through the cover element 4 within the coupling-in region 4.1, the laser beams $S_1, \ldots, S_n$ impinging on the cover element are, on the one hand, deflected and, on the other hand, pre-collimated in the direction of the fast axis fa and the slow axis sa of the laser diodes $1.1, \ldots, 1.n$ in such a way that they impinge on the center MP of the scanning mirror 2 at the same small convergence angle in the direction of the fast axis fa and the slow axis sa, and are fully collimated after passing through the cover element 4 within the coupling-out region 4.2.

Figure 4:
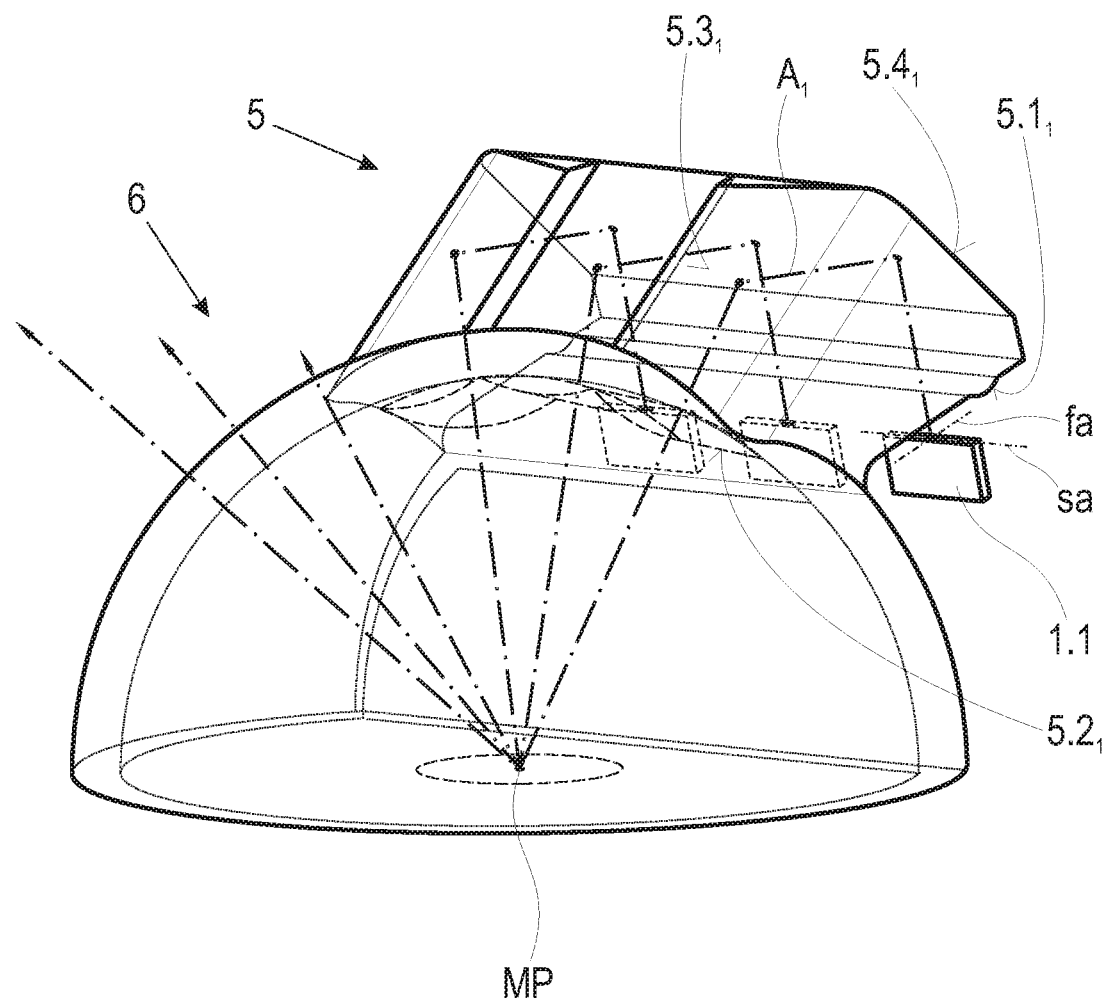
FIG. 4 shows a design of the second exemplary embodiment of a transmitting device in a perspective view.
Figure 5:
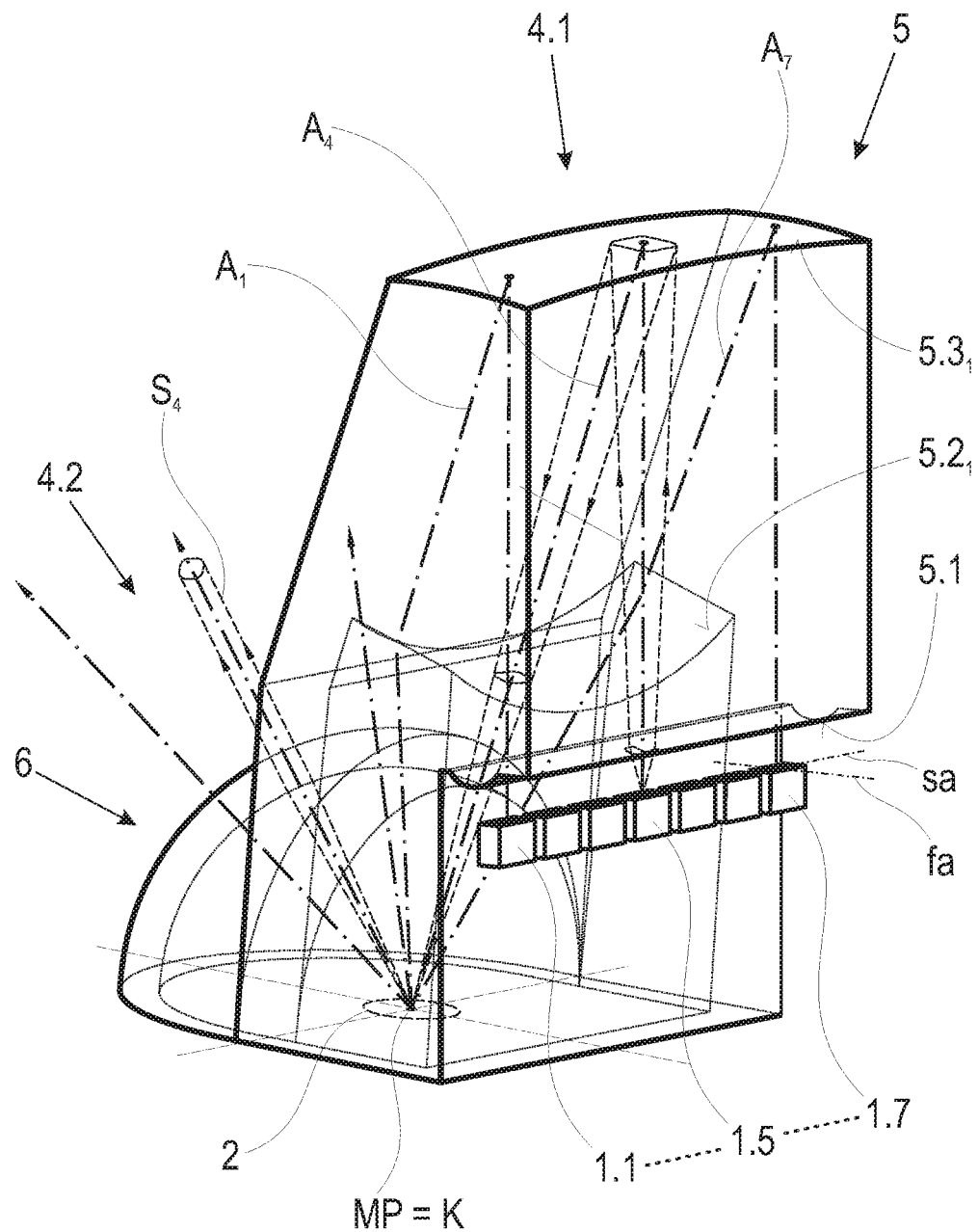
FIG. 5 shows a design of the third exemplary embodiment of a transmitting device in a perspective view.

Advantageously, the cover element 4 is formed by a shell 6 and an optical block 5 integrated into it as shown in FIG. 4. The cover element 4 may, also advantageously, be formed by a shell 6 and an adjacent optical block 5 as shown in FIG. 5. In this case, the section of the hemispherical shell HK is formed on the shell 6 and the toroidal entrance surface 5.1, the at least two first mirror surfaces $5.3_1, \ldots, 5.3_n$ and the at least one toroidal exit surface $5.2_1, \ldots, 5.2_n$ are formed on the optical block 5.

The shell 6 advantageously constitutes a part of the hemispherical shell HK.

FIGS. 1A to 1C show a first exemplary embodiment comprising, as an example, three laser diodes 1.1, 1.2, 1.3, including the laser beam $S_2$ emitted by the laser diode 1.2 and the beam axes $A_1, A_2, A_3$ of the laser diodes 1.1, 1.2, 1.3. The laser beams $S_1, S_2, S_3$ are pre-collimated by refraction at the toroidal entrance surface $5.1_1$ in the direction of the fast axis fa. Here, the toroidal entrance surface $5.1_1$ represents a cylindrical surface.

The number of first mirror surfaces $5.3_1, 5.3_2, 5.3_3$ present is equal to the number of laser beams $S_1, S_2, S_3$ present. The first mirror surfaces $5.3_1, 5.3_2, 5.3_3$ are planar surfaces inclined to each other, with their size and the distance between their centers as well as the angle of inclination between the adjacent planar surfaces each being determined by the distance of the laser diodes 1.1, 1.2, 1.3. While the middle one of the three laser beams, $S_2$, is deflected only in a plane containing the fast axis fa, the outer laser beams $S_1$, $S_3$ are also deflected in a plane perpendicular thereto so that all three laser beams $S_1$, $S_2$, $S_3$ impinge on the center MP of the scanning mirror 2. The first mirror surfaces $5.3_1$, $5.3_2$, $5.3_3$ do not affect the collimation of the laser beams $S_1$, $S_2$, $S_3$. Each of the first mirror surfaces $5.3_1$, $5.3_2$, $5.3_3$ is assigned a toroidal exit surface $5.2_1$, $5.2_2$, $5.2_3$. The toroidal exit surfaces $5.2_1$, $5.2_2$, $5.2_3$ can each be a cylindrical surface and therefore collimate only in the direction of the slow axis sa, but are preferably toroidal surfaces that collimate in the slow axis sa and additionally in the fast axis fa, so that the entrance surface 5.1 can have a lower refractive power. Spherical surfaces can be advantageously provided for this purpose if the beam angle of the laser beams $S_1$, $S_2$, $S_3$ in the direction of the fast axis fa has already been adapted to the beam angle in the direction of the slow axis sa by the pre-collimation of the laser beams $S_1$, $S_2$, $S_3$ at the toroidal entrance surface 5.1. The pre-collimated laser beams $S_1$, $S_2$, $S_3$ should be slightly convergent to then be completely collimated by the refraction in the coupling-out region 4.2, which has a negative refractive power.

Figure 2A:
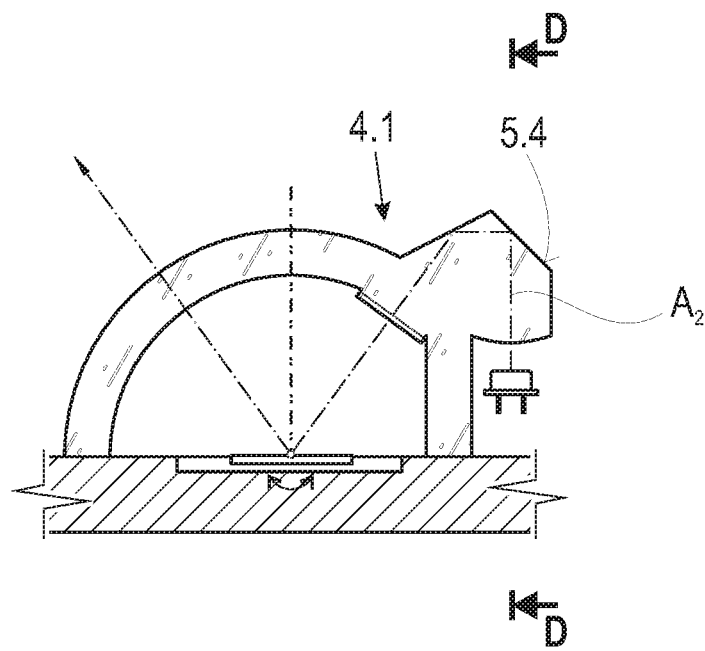
FIGS. 2A-2B are schematic diagrams showing a second exemplary embodiment of a transmitting device.
Figure 2B:
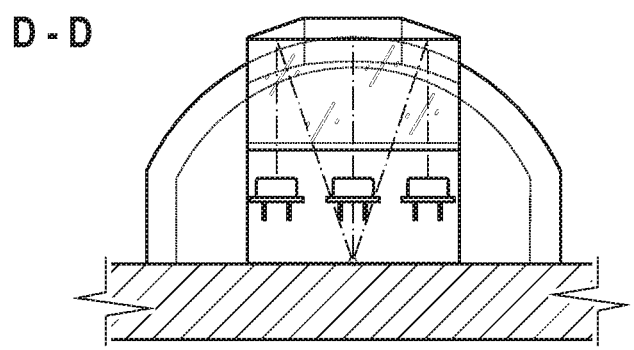

The second exemplary embodiment shown in FIG. 2A and FIG. 2B differs from the first exemplary embodiment in that there is a second mirror surface 5.4 in the coupling-in region 4.1. The second mirror surface 5.4 only serves to fold the laser beams $S_1$, $S_2$, $S_3$ in order to be able to minimize the space required and vary the position of the entrance surface 5.1 and the laser diodes 1.1, 1.2, 1.3.

FIG. 4 shows a perspective view of a design of the second exemplary embodiment. It is clearly evident here that the shape of the cover element 4 has been adapted outside the coupling-in and coupling-out regions 4.1, 4.2 to minimize the space required.

Figure 3A:
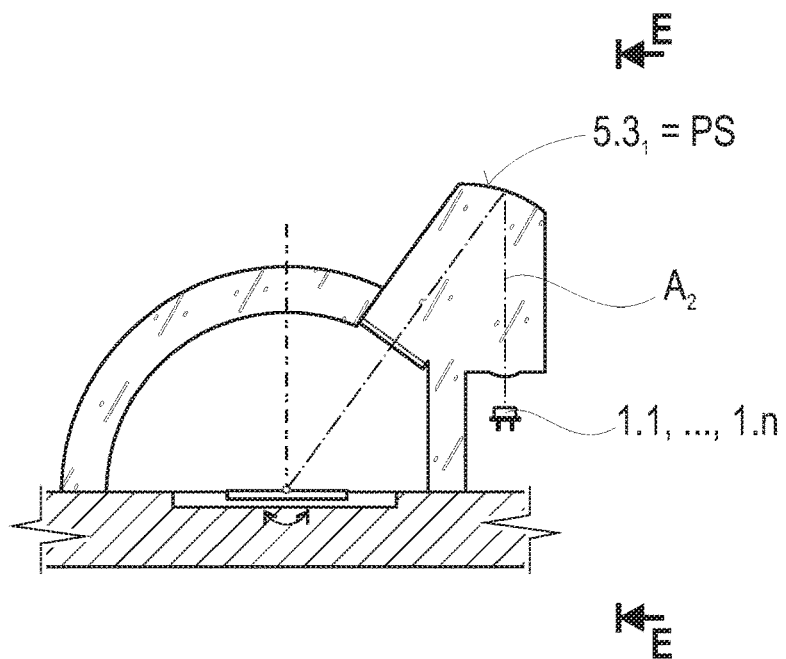
FIGS. 3A-3B are schematic diagrams showing a third exemplary embodiment of a transmitting device.
Figure 3B:
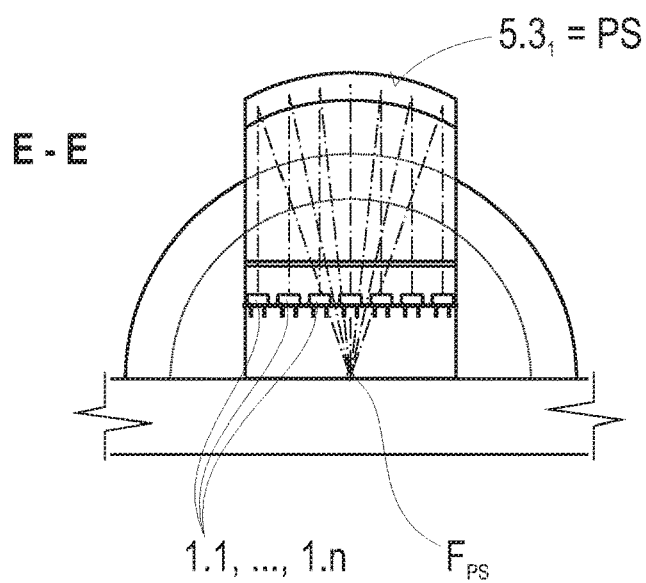

The third exemplary embodiment shown in FIGS. 3A and 3B is particularly advantageous for a larger number of laser diodes 1.1, ..., 1.n or if the distances between the beam axes $A_1$, ..., $A_n$ are specified. Instead of having the same number of first mirror surfaces $5.3_1$, ..., $5.3_n$ as there are laser diodes 1.1, ..., 1.n, there is only one first mirror surface $5.3_1$ here, which is a parabolic mirror surface PS with a focal point $F_{PS}$ and is arranged in such a way that the focal point $F_{PS}$ would coincide with the center of curvature K and the center MP if the refractive power of the, in this case, one toroidal exit surface $5.2_1$, arranged downstream, were theoretically neglected. Regardless of the distance between the laser diodes 1.1, ..., 1.n and thus the beam axes $A_1$, ..., $A_n$, the axis beams $A_1$, ..., $A_n$ are reflected into the focal point $F_{PS}$ and thus into the center MP of the scanning mirror 2. The parabolic mirror surface PS can be a toroidal parabolic mirror surface, which strictly speaking results in a focal line, which however contains a point where all axis beams $A_1$, ..., $A_n$ meet and which is understood to be the focal point $F_{PS}$.

The one toroidal exit surface $5.2_1$ is in this case an aspherical cylindrical surface, with the cylinder axes of the entrance surface 5.1 and the one exit surface $5.2_1$ being perpendicular to each other.

The shell 6 and the optical block 5 can be manufactured individually and connected to each other, preferably by gluing. However, they are advantageously manufactured monolithically from one piece.

A special case not shown in the Figures is a transmitting device with only one laser diode 1.1. There is no need here for a first mirror surface $5.3_1$, since the one beam axis $A_1$ of the just one laser beam $S_1$ can be directed directly at the center MP of the scanning mirror 2. In the coupling-in region 4.1 the laser beam $S_1$ is then guided only over the entrance surface 5.1 and one exit surface $5.2_1$.

All embodiments of a transmitting device according to the invention have the advantage that the entire beam beam shaping for collimation and the beam deflection of the laser diode beams $S_1$, ..., $S_n$ towards the scanning mirror 2 take place within the cover element 4, thus providing a compact, low-adjustment design.

LIST OF REFERENCE NUMERALS 1.1, ..., 1.n laser diode
2 scanning mirror
3 housing
4 cover element
4.1 coupling-in region (of the cover element 4)
4.2 coupling-out region (of the cover element 4)
5 optical block
5.1 entrance surface (of the optical block 5)
$5.2_1$, ..., $5.2_n$ exit surface (of the optical block 5)
$5.3_1$, ..., $5.3_n$ first mirror surface (of the optical block 5)
5.4 second mirror surface (of the optical block 5)
6 shell
$S_1$, ..., $S_n$ laser beam
$A_1$, ..., $A_n$ beam axis (of the laser beam $S_1$, ..., $S_n$)
fa fast axis (of the laser diode 1.1, ..., 1.n)
sa slow axis (of the laser diode 1.1, ..., 1.n)
MP center (of the scanning mirror 2)
L perpendicular
HK monocentric hemispherical shell
PS parabolic mirror surface
$F_{PS}$ focal point of the parabolic mirror surface
$\alpha_1$, ..., $\alpha_n$ angle of incidence

What is claimed is:

1. A transmitting device comprising:
a housing with a transparent cover element;
at least one laser diode serving to emit at least one laser beam with a beam axis and with different angles of radiation along a fast axis and along a slow axis, wherein, in the case of at least two laser diodes, said at least two laser diodes being arranged side by side in the direction of their slow axis forming a row and having parallel beam axes;
a scanning mirror capable of being deflected about its center MP and arranged inside the housing, wherein the beam axis of the at least one laser beam is directed at the transparent cover element in such a way that the at least one laser beam impinges on the center MP after the at least one laser beam passes through the transparent cover element within a coupling-in region, and that the at least one laser beam passes through the transparent cover element again within a coupling-out region after being reflected at the scanning mirror;
the transparent cover element having a coupling-in region, in which;
a toroidal entrance surface in a form of a cylindrical surface is provided for pre-collimating the at least one laser beam in a direction of the fast axis only, and either at least one toroidal exit surface is provided for pre-collimating the at least one laser beam in both directions of the slow axis and of the fast axis, or at least one toroidal exit surface in a special form of a cylindrical surface is provided for pre-collimating the at least one laser beam in a direction of the slow axis only;
and
the transparent cover element having a coupling-out region comprising a section of a monocentric hemispherical shell HK with a center of curvature, wherein the transparent cover element is arranged to cover the scanning mirror in such a way that the center of curvature K and the center MP of the scanning mirror coincide.

2. The transmitting device according to claim 1, wherein the transparent cover element is formed by a shell and an optical block integrated into the transparent cover element or adjacent to it, wherein the section of the monocentric hemispherical shell HK is formed on the shell and the toroidal entrance surface shaped as cylindrical surface, the at least one toroidal exit surface, and, in the case of at least two laser diodes, first mirror surfaces are formed on the optical block, the first mirror surfaces being respectively assigned to the at least two laser diodes for deflecting each of the at least two laser beams to the center MP.

3. The transmitting device according to claim 2, wherein the shell is a part of the monocentric hemispherical shell (HK).

4. The transmitting device according to claim 2, wherein the transmitting device has the at least two laser diodes and wherein the first mirror surfaces are planar surfaces inclined relative to each other so that the at least two laser beams are deflected at different angles.

5. The transmitting device according to claim 4, wherein the optical block has a second mirror surface for folding the at least two laser beams.

6. The transmitting device according to claim 2, wherein the transmitting device has the at least two laser diodes and wherein one first mirror surface is a parabolic surface (PS), so that the at least two laser beams are deflected at different angles.

7. The transmitting device according to claim 6, wherein the optical block has a second mirror surface for folding the at least two laser beams.

8. The transmitting device according to claim 1, wherein the transparent cover element is manufactured monolithically.

9. The transmitting device according to claim 1, wherein only one laser diode is present and a first mirror surface for deflecting one laser beam to the center (MP) of the scanning mirror is assigned to the one laser diode.

* * * * *